United States Patent
Tracy et al.

(10) Patent No.: US 6,534,869 B2
(45) Date of Patent: *Mar. 18, 2003

(54) METHOD FOR REDUCING STRESS-INDUCED VOIDS FOR 0.25 μM MICRON AND SMALLER SEMICONDUCTOR CHIP TECHNOLOGY BY ANNEALING INTERCONNECT LINES PRIOR TO ILD DEPOSITION AND SEMICONDUCTOR CHIP MADE THEREBY

(75) Inventors: Bryan Tracy, Oakland; Paul R. Besser, Sunnyvale; Minh Van Ngo, Union City, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 190 days.

(21) Appl. No.: 09/128,057

(22) Filed: Jul. 29, 1998

(65) Prior Publication Data

US 2001/0040295 A1 Nov. 15, 2001

(51) Int. Cl.$^7$ .............................................. H01L 23/52
(52) U.S. Cl. .................. 257/759; 257/499; 257/506; 257/765; 257/771; 257/763; 257/764
(58) Field of Search ............................... 257/499, 506, 257/759, 765, 771

(56) References Cited

U.S. PATENT DOCUMENTS 4,980,752 A * 12/1990 Jones .......................... 257/765
5,345,108 A * 9/1994 Kikkawa ..................... 257/751
5,635,763 A * 6/1997 Inoue et al. ................. 257/763
5,990,558 A * 11/1999 Tran ........................... 257/759
6,017,614 A * 1/2000 Tsai et al. .................... 428/209
6,150,285 A * 11/2000 Besser et al. ................ 438/787

FOREIGN PATENT DOCUMENTS

EP 0 239 833 A2 * 10/1987
EP 273 629 * 7/1988

OTHER PUBLICATIONS

Kikkawa et al, "A quarter–micrometer interconnection technolgy using a TiN/Al–Si–Cu/TiN/Al–Si–Cu/TiN/Ti multilayer structure" IEEE Transactions on Electronic Devices, vol. 40, No. 2, Feb. 1993.*

* cited by examiner

Primary Examiner—Nathan Flynn
Assistant Examiner—Ahmed N. Sefer
(74) Attorney, Agent, or Firm—LaRiviere, Grubman & Payne, LLP

(57) ABSTRACT

A method for making 0.25-micron semiconductor chips includes annealing the metal interconnect lines prior to depositing an inter-layer dielectric (ILD) between the lines. During annealing, an alloy of aluminum and titanium forms first, which subsequently volumetrically contracts, thereby forming a titanium aluminide compound, with the contraction being absorbed by the aluminum. Because the alloy is reacted to form the metal compound prior to ILD deposition, however, the aluminum is not constrained by the ILD when it attempts to absorb the contraction of the alloy. Consequently, the likelihood of undesirable void formation in the interconnect lines is reduced.

7 Claims, 2 Drawing Sheets

METHOD FOR REDUCING STRESS-INDUCED VOIDS FOR 0.25 μM MICRON AND SMALLER SEMICONDUCTOR CHIP TECHNOLOGY BY ANNEALING INTERCONNECT LINES PRIOR TO ILD DEPOSITION AND SEMICONDUCTOR CHIP MADE THEREBY

TECHNICAL FIELD

The present invention relates generally to semiconductor fabrication, and more particularly to methods for improving the reliability of 0.25-μm technology semiconductors by alleviating stress in intam otherwise result in the formation of voids in the interconnect lines.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

In chips that hold integrated circuits, the individual circuit components are interconnected by conductive elements referred to as "interconnect lines." These interconnect lines are typically arranged in a multi-layered pattern that is deposited on a semiconductive substrate such as silicon. To insulate the interconnect lines from each other, insulative material is deposited between adjacent interconnect line layers.

With the above in mind, so-called 0.25-micron technology has been developed, in which the distance between adjacent layers of interconnect lines in an integrated circuit on a semiconductor chip is equal to or less than about three-eighths of a micron. With such a small spacing between interconnect lines, which have heights of about 1.1 microns, the size of the circuits on the chip can be reduced to result in the above-noted advantages.

Typically, each electrically conductive interconnect line is made of a "stack" of metal layers that typically includes a layer made of aluminum or aluminum alloy, and one or more other metal layers. The aluminum is deposited as a film over the substrate and is then lithographically patterned and chemically etched to form a desired pattern for the circuit's connector lines. Then, a process referred to as high density plasma (HDP) inter-layer dielectric (ILD) formation is used to fill the gaps between adjacent metal stacks with an electrically non-conductive material. Ordinarily, the ILD deposition step is undertaken at relatively high temperature, incidentally precipitating the formation of an intermetallic structure. In current applications, titanium is commonly used as an underlayer for the aluminum, and the intermetallic structure that forms in such a device is $TiAl_3$. Also, an overlayer that includes TiN anti-reflective coating (ARC) is disposed over the stacks, for lithography purposes.

As understood herein, however, voids caused by hydrostatic stresses undesirably can form in the aluminum, and the voiding of the aluminum can be accelerated by the formation of the intermetallic structure. This is undesirable, because when a void forms in a thin aluminum line, the current path through the line unfortunately is diverted, thereby adversely affecting the reliability of the chip.

The present invention understands that the above-mentioned hydrostatic stresses arise because the thermal expansion coefficient of the aluminum layer is different from the thermal expansion coefficient of the encapsulating ILD and the silicon substrate, both of which mechanically constrain the aluminum. Furthermore, when an intermetallic structure such as $TiAl_3$ is formed, the intermetallic structure can volumetrically contract (by 5.9%, in the case of $TiAl_3$), and the aluminum in the intermetallic structure, which is the most compliant metal in the stack, will consequently absorb the contraction-induced strain and thus have an even higher stress state as a result.

Fortunately, the present invention recognizes that contrary to previous methods, it is possible to anneal the metal stacks prior to ILD deposition in 0.25-μm semiconductors, when only the substrate, and not the ILD, constrains the aluminum in the stacks. As recognized by the present invention, the consequence is that the likelihood of void formation in the interconnect lines is reduced, thereby improving 0.25-μm chip reliability.

BRIEF SUMMARY OF THE INVENTION

A method is disclosed for making a semiconductor chip having electrically conductive interconnect lines. The method includes providing at least one substrate, and establishing at least one predetermined pattern of electrically conductive interconnect lines on the substrate. In accordance with the present invention, prior to depositing a dielectric layer between the interconnect lines, the lines are annealed.

In a preferred embodiment, each line establishes a stack including at least one layer having aluminum therein and at least one layer having titanium therein, and an alloy of titanium and aluminum (i.e., Ti—Al) is formed at the beginning of an annealing step, whereby a metal compound (i.e., $TiAl_3$) is formed at the end of the annealing step. Preferably, the annealing step is undertaken by heating the electrically conductive lines to a temperature of between three hundred fifty degrees Celsius and four hundred fifty degrees Celsius (350° C.–450° C.) for a period of between ten minutes and ninety minutes (10 min–90 min), whereby a compound of titanium and aluminum results (i.e., $TiAl_3$). Moreover, the electrically conductive lines are exposed to one or more annealing gases, including nitrogen and hydrogen, during the annealing step. In one preferred embodiment, the ILD is TEOS that is deposited by directing TEOS onto the lines while simultaneously removing excess TEOS by sputtering. A chip made according to the present method, and a computing device incorporating the chip, are also disclosed.

In another aspect, a semiconductor chip includes at least one substrate and at least one predetermined pattern of aluminum lines supported by the substrate, with adjacent lines being separated by distances equal to or less than about three-eighths of a micron. An alloy of aluminum and titanium is on the lines, with the Ti—Al alloy having been reacted, thereby forming the $TiAl_3$ compound prior to insulating the lines from each other.

In still another aspect, a method for making a semiconductor chip includes establishing plural electrically conductive lines on at least one substrate. At least first lines are separated from second lines by distances equal to or less than three-eighths of a micron. The method further includes reacting a metal alloy on the lines, thereby forming the metal compound and, after reacting the alloy to form the metal compound, depositing a dielectric between at least two lines that are adjacent each other. With this method, the dielectric does not constrain the lines during the reacting step.

Other features of the present invention are disclosed or apparent in the section entitled: "DETAILED DESCRIPTION OF THE INVENTION"

BRIEF DESCRIPTION OF DRAWINGS

For fuller understanding of the present invention, reference is made to the accompanying drawing in the following detailed description of the Best Mode of Carrying Out the Present Invention. In the drawings.

Figure 1:
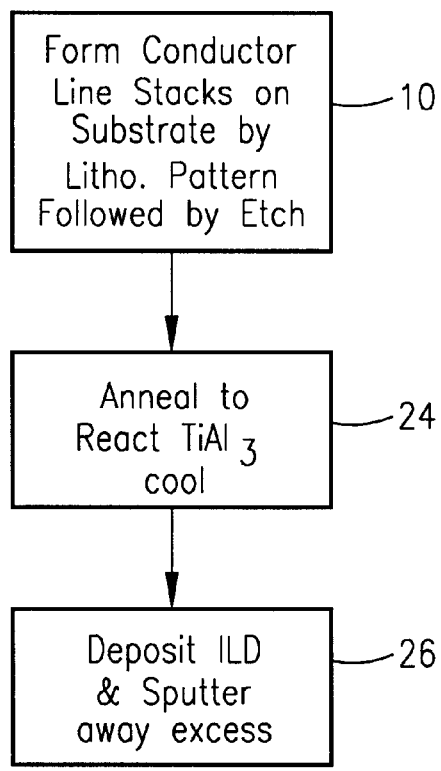
FIG. 1 is a flow chart of the present process for making a 0.25-μm technology semiconductor chip.

Reference numbers refer to the same or equivalent parts of the present invention throughout the several figures of the drawing. In the description, the terms "vertical" and "horizontal" refer to the orientations of the figures shown, for purposes of disclosure, and do not necessarily refer to the orientation of the present wafer once the wafer is embodied in a computing device.

DETAILED DESCRIPTION OF THE INVENTION

Figure 2:
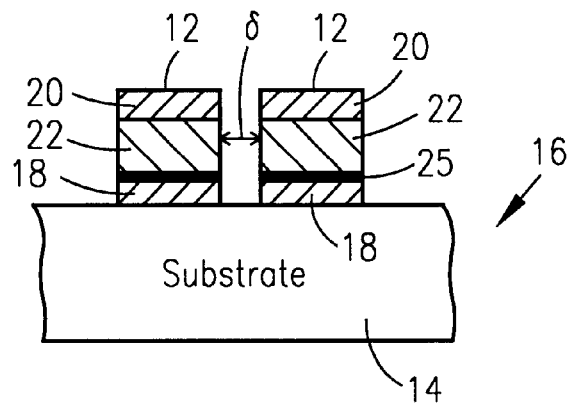
FIG. 2 is a schematic diagram of the substrate showing the chip after conductor line stack formation.

Referring initially to FIGS. 1 and 2, the process of the present invention in producing 0.25-μm technology computer chips can be understood. Commencing at block 10 in FIG. 1 and as shown in FIG. 2, plural stacks 12 are formed on a substrate 14. Each stack 12 is a metallic, electrically-conductive stack that defines a respective interconnect line for an integrated circuit chip, generally designated 16. The chip 16 can establish an integrated circuit such as a microprocessor or a flash memory chip (e.g., an electrically programmable memory (EPROM)) for use in the computer arts. Although only two stacks 12 are shown for clarity of disclosure, it is to be understood that more than two stacks 12 typically are formed on the substrate 14.

Preferably, the substrate 14 includes a semiconductor such as silicon. Also, the substrate 14 can include a number of devices, such as metal oxide silicon field effect transistor (MOSFET) devices, that are electrically connected to one or more of the stacks 12 via connector plugs.

In the preferred embodiment, each stack 12 includes a respective lower titanium layer 18 abutting the substrate 14, an upper titanium layer 20 parallel to and spaced from the lower titanium layer 18, and an aluminum layer 22 sandwiched therebetween. The titanium layers can be titanium or a titanium alloy such as titanium nitride. It is to be understood that greater or fewer layers can be provided. In a preferred embodiment, the aluminum layer 22 is made of aluminum or an aluminum alloy including aluminum and from 0.1% to about 10% by weight of one or more of copper (Cu), nickel (Ni), zinc (Zn), gold (Au), titanium (Ti), indium (In), chromium (Cr), silver (Ag), palladium (Pd), and platinum (Pt).

The stacks are patterned on the wafer substrate 14 in accordance with means known in the art, e.g., by depositing the various metallic layers as films, covering the films with a mask, and then directing ultraviolet light against the exposed portions of the films. After lithographic patterning, chemical etching is used to remove portions of metal not in the pattern to establish the predetermined pattern of aluminum conductive lines of the chip 16, as shown in FIG. 2.

As can be appreciated in reference to FIG. 2, the chip 16 a so-called "quarter micron chip," in that the distance δ between adjacent stacks 12 is about equal to or less than three-eigths of a micron (0.375-μm).

Moving to block 24 in FIG. 1, after forming the stacks 12, the stacks 12 are annealed to form an intermetallic in the stacks 12, with an alloy structure 25 being formed at the interface between each layer of aluminum and a layer of titanium (only a single alloy structure shown for clarity of disclosure). In the preferred embodiment, the metal alloy is an alloy of aluminum and titanium (i.e., Ti—Al), and, more specifically, a titanium aluminide metal compound ($TiAl_3$) is formed from the Ti—Al alloy. Preferably, the annealing at block 24 is undertaken by heating the stacks 12 to a temperature of between three hundred fifty degrees Celsius and four hundred fifty degrees Celsius (350° C.–450° C.) for a period of between ten minutes and ninety minutes. Also, during the annealing step the stacks 12 are exposed to one or more annealing gases, preferably nitrogen at a flow rate of between eleven standard liters per minute and fourteen standard liters per minute (11.0 slm–14.0 slm) and hydrogen at a flow rate of between one standard liter per minute and two standard liters per minute (1.0 slm–2.0 slm).

After annealing, the chip 16 is cooled, during which time the $TiAl_3$ contracts. Accordingly, as provided by the present invention the $TiAl_3$, which would otherwise form during ILD deposition and contract during the subsequent cool down when the stacks 12 are constrained by the ILD, is instead formed prior to ILD deposition, thus permitting the aluminum in the stacks 12 to absorb contraction from the $TiAl_3$ before the stacks 12 are constrained by the ILD. This reduces the likelihood that voids will undesirably form in the interconnect lines of the chip 16.

Figure 3:
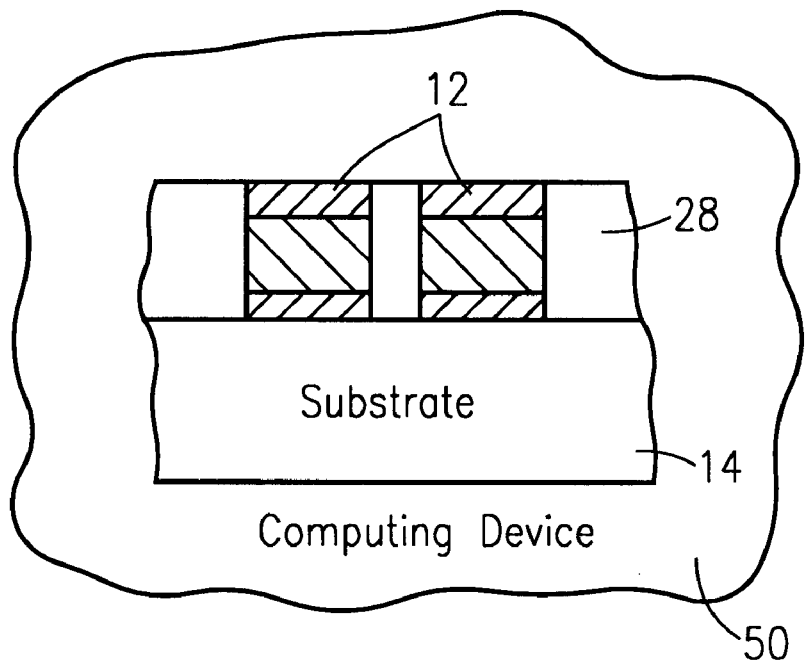
FIG. 3 is a schematic cross-sectional diagram of the substrate showing the chip after ILD deposition/etching, schematically showing a computing device that incorporates the chip.

Moving to block 26 of FIG. 1 and referring to FIG. 3, an interlayer dielectric (ILD) 28 is deposited between the stacks 12 to insulate the stacks 12. While the present invention envisions using any appropriate high density plasma (HDP) ILD such as silane, in the preferred embodiment the ILD used is tetraethoxy silane (TEOS), to avoid the production of free hydrogen that could otherwise embrittle the aluminum.

Figure 4:
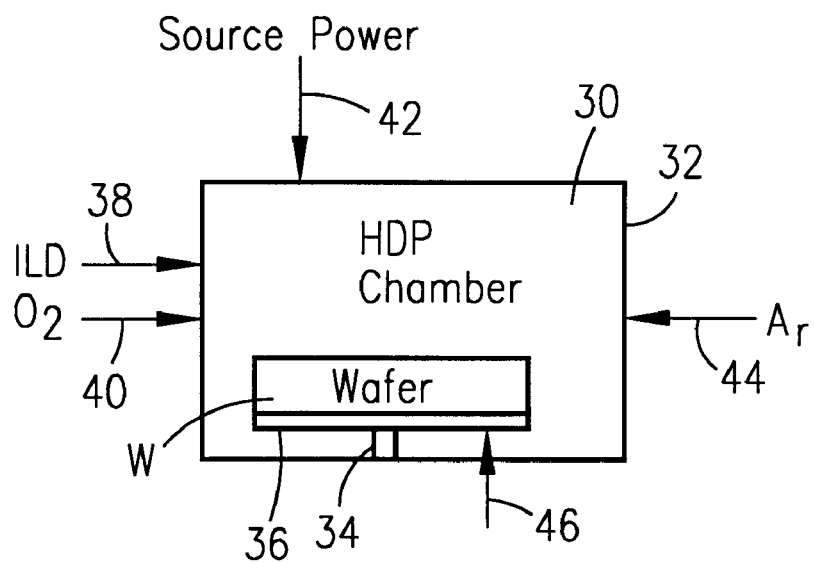
FIG. 4 is a schematic diagram of a high density plasma gap fill deposition chamber.

Accordingly, to understand the preferred embodiment cross-reference is made to FIGS. 3 and 4. An HDP chamber 30 (FIG. 4) is enclosed by a wall 32. A support 34 is disposed in the chamber 30, and the support 34 may hold an e-chuck 36. One or more wafers or substrates 22 are in turn disposed on the e-chuck 36.

To provide for depositing ILD on the wafer w, a TEOS inlet 38 and an oxygen inlet 40 are associated with the chamber wall 32 to respectively direct TEOS and oxygen into the chamber 30, and a source power lead 42 is likewise associated with the chamber 30. In the preferred embodiment, TEOS is directed into the chamber 30 at a rate ranging from one half milliliter per minute to three milliliters per minute (0.5 mL/min–3.0 mL/min). In contrast, oxygen is directed into the chamber 30 at a rate ranging from ten standard cubic centimeters per minute to fifty standard cubic centimeters per minute (10 SCCM–50 SCCM). The pressure within the chamber 30 is maintained between one milliTorr and three Torr (1 mTorr–3 Torr), and the source power applied to the chamber 30 is between five hundred Watts and five thousand Watts (500 W–5000 W).

To provide for simultaneous sputtering of TEOS while the TEOS is being deposited, an etchant inlet 44 is associated with the wall 32 to port a gaseous sputtering agent, preferably argon, into the chamber 30. Also, a bias power lead 46 is connected to the e-chuck 36, and bias power is maintained at about three thousand watts (3000 W).

If desired, both the annealing step and the subsequent ILD deposition step can be undertaken in the chamber 30. If the annealing step is to be undertaken in the chamber 30, nitrogen and hydrogen inlets (not shown) are provided in the chamber 30.

The completion of the chip 16 may proceed in any such manner as is required by its design. The resulting chip 16 can be incorporated into a computing device 50 (FIG. 3), e.g., a computer, digital camera, wireless telephone, or hand held computer, for use by the computing device 50.

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more." The inventions illustratively disclosed herein may be practiced without any element which is not specifically disclosed herein.

What is claimed is:

1. A semiconductor chip, comprising:
   a semiconductor substrate;
   at least one predetermined pattern of aluminum (Al) lines supported by the substrate, the lines having a reduced void-content,
      adjacent lines being separated by distances equal to or less than about three-eighths of a micron,
      at least one line of the pattern comprising a stack, the stack comprising
         at least one first type layer comprising aluminum (Al), and
         at least one second type layer comprising titanium (Ti); and
   at least one intermetallic layer sandwiched between the at least one first type layer and the at least one second type layer,
      the intermetallic layer comprising a titanium aluminide ($TiAl_3$) compound,
      the $TiAl_3$ compound being reacted prior to insulating the lines from each other,
   said at least one first type layer comprising a metal additive, and
   said metal additive comprising at least one metal selected from a group consisting essentially of nickel (Ni), zinc (Zn), indium (In), chromium (Cr), and platinum (Pt).

2. A computing device incorporating the semiconductor chip of claim 1.

3. A chip, as recited in claim 1, wherein said at least one first type layer comprises said metal additive in a concentration range of approximately 0.1 weight % to approximately 10 weight %.

4. A chip, as recited in claim 1,
   wherein said insulating of the lines from each other comprises depositing an interlayer dielectric (ILD), and
   wherein said ILD does not constrain the lines during formation of the intermetallic layer.

5. A chip, as recited in claim 4, wherein said ILD comprises tetraethoxysilane (TEOS).

6. A chip, as recited in claim 1, wherein said metal additive further comprises at least one metal selected from a group consisting essentially of copper (Cu) and titanium (Ti), gold (Au), silver (Ag), palladium (Pd).

7. A semiconductor chip, comprising:
   at least one substrate;
   at least one predetermined pattern of aluminum (Al) lines supported by the substrate, the lines having a reduced void-content,
      adjacent lines being separated by distances equal to or less than about three-eighths of a micron,
      at least one line of the pattern comprising a stack, the stack comprising
         at least one first type layer comprising aluminum (Al), and
         at least one second type layer comprising titanium (Ti); and
   at least one intermetallic layer sandwiched between the at least one first type layer and the at least one second type layer,
      the intermetallic layer comprising a titanium aluminide ($TiAl_3$) compound,
      the $TiAl_3$ compound being reacted prior to insulating the lines from each other,
   wherein said at least one first layer comprises a metal additive,
   wherein said metal additive comprises at least one metal selected from a group consisting essentially of nickel (Ni), zinc (Zn), gold (Au), indium (In), chromium (Cr), silver (Ag), palladium (Pd), and platinum (Pt), wherein said metal additive further comprises at least one metal selected from a group consisting essentially of copper (Cu) and titanium (Ti), wherein said at least one first type layer comprises said metal additive in a concentration range of approximately 0.1 weight % to approximately 10 weight %,
   wherein said insulating of the lines from each other comprises depositing an interlayer dielectric (ILD),
   wherein said ILD does not constrain the lines during formation of the intermetallic layer, and
   wherein said ILD comprises tetraethoxysilane (TEOS).

* * * * *

UNITED STATES PATENT AND TRADEMARK OFFICE
CERTIFICATE OF CORRECTION

PATENT NO.    : 6,534,869 B2                                           Page 1 of 1
DATED         : March 18, 2003
INVENTOR(S)   : Bryan Tracy, Paul R. Besser and Minh Van Ngo It is certified that error appears in the above-identified patent and that said Letters Patent is hereby corrected as shown below:

<u>Title page, Item [54] and Column 1, line 2,</u>
Title, replace "0.25 µM MICRON" with -- 0.25 MICRON --.

Signed and Sealed this

Sixth Day of May, 2003

JAMES E. ROGAN
*Director of the United States Patent and Trademark Office*